(12) United States Patent
Lin et al.

(10) Patent No.: US 11,626,398 B2
(45) Date of Patent: Apr. 11, 2023

(54) SEMICONDUCTOR STRUCTURE AND METHOD FOR MANUFACTURING THEREOF

(71) Applicant: TAIWAN SEMICONDUCTOR MANUFACTURING COMPANY LTD., Hsinchu (TW)

(72) Inventors: Ta-Wei Lin, Chiayi County (TW); Fu-Hsiung Yang, Taoyuan County (TW); Ching-Hsun Hsu, Hsinchu (TW); Yu-Lun Lu, Hsinchu (TW); Li-Hsuan Yeh, New Taipei (TW); Tsung-Chieh Tsai, Hsin-Chu County (TW); Kong-Beng Thei, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 33 days.

(21) Appl. No.: 17/198,789

(22) Filed: Mar. 11, 2021

(65) Prior Publication Data
US 2022/0293590 A1    Sep. 15, 2022

(51) Int. Cl.
*H01L 29/78* (2006.01)
*H01L 27/088* (2006.01)
*H01L 27/06* (2006.01)
*H01L 29/66* (2006.01)
*H01L 29/861* (2006.01)

(52) U.S. Cl.
CPC ...... *H01L 27/0629* (2013.01); *H01L 29/6609* (2013.01); *H01L 29/66545* (2013.01); *H01L 29/861* (2013.01)

(58) Field of Classification Search
None
See application file for complete search history.

(56) References Cited

U.S. PATENT DOCUMENTS

2014/0159157 A1*  6/2014  Jensen ............... H01L 27/0207
                                              438/294

\* cited by examiner

*Primary Examiner* — Joseph C. Nicely
*Assistant Examiner* — Lamont B Koo
(74) *Attorney, Agent, or Firm* — WPAT Law; Anthony King (57) ABSTRACT

A semiconductor structure is provided. The semiconductor structure includes a substrate, a diode region, and a dummy stripe. The substrate has a first surface. The diode region is in the substrate. The diode region includes a first implant region of a first conductivity type approximate to the first surface, and a second implant region of a second conductivity type approximate to the first surface and surrounded by the first implant region. The dummy stripe is on the first surface and located between the first implant region and the second implant region. A method for manufacturing a semiconductor structure is also provided.

20 Claims, 13 Drawing Sheets

SEMICONDUCTOR STRUCTURE AND METHOD FOR MANUFACTURING THEREOF

FIELD

The present disclosure relates to a semiconductor structure and method for manufacturing thereof, particularly, the disclosed semiconductor structure has a diode with a dummy stripe thereof. The dummy stripe may be used to prevent a metal residue left in an unwanted recess in a diode region due to chemical mechanical polishing operation.

BACKGROUND

The integrated circuit (IC) manufacturing industry has experienced exponential growth over the past decades. During the development of integrated circuits, the functional density, i.e., the number of interconnection elements per chip area, has generally increased, while the size of the geometry has decreased. Currently, there are some development of integrated circuits which include high voltage (HV)/middle voltage (MV) diode and high-k metal gate (HKMG) technology. Embedded diode is a technology in which a diode structure is integrated with transistors in the same semiconductor structure, for example, may be formed as a portion of the front-end-of-line structure as well. HKMG technology is a technology for manufacturing semiconductor devices using a metal gate electrode and a high-k gate dielectric layer.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer, or section from another. The terms such as "first", "second", and "third" when used herein do not imply a sequence or order unless clearly indicated by the context.

Figure 1A:
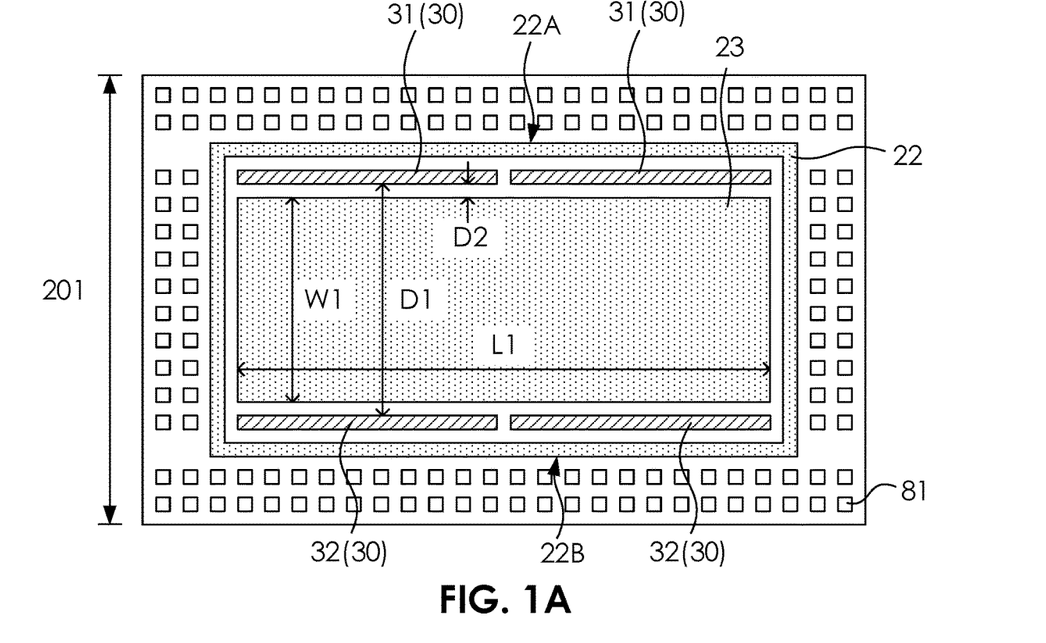
FIG. 1A illustrates a top view of a portion semiconductor structure according to some embodiments of the present disclosure.
Figure 1B:
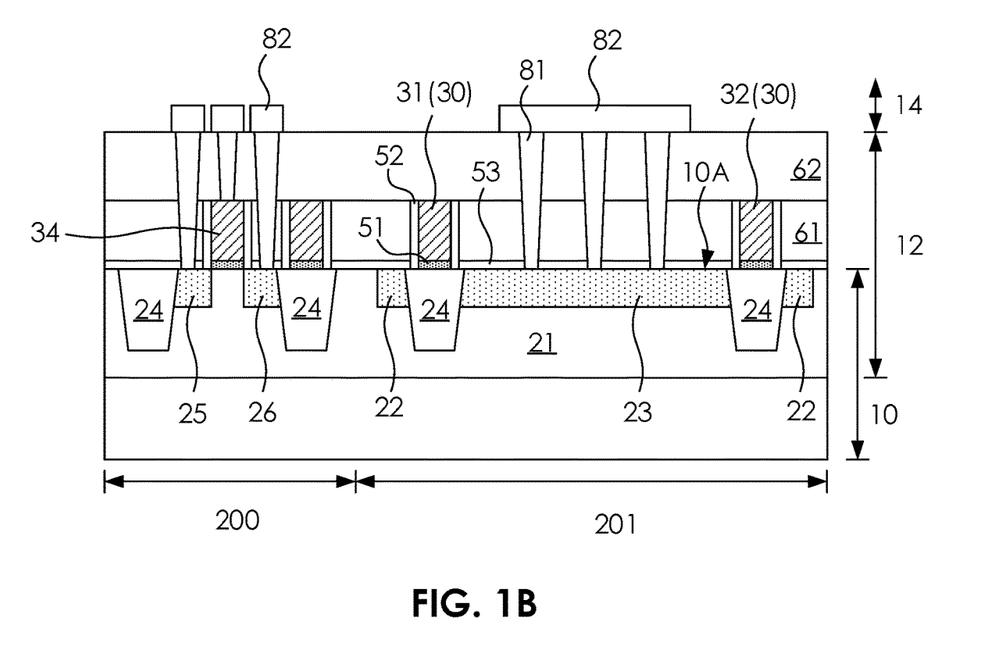
FIG. 1B illustrates a cross-sectional view of a semiconductor structure according to some embodiments of the present disclosure.

FIG. 1A illustrates a semiconductor structure which includes a diode in a front-end-of-line (FEOL) structure according to some embodiments of the present disclosure from a top view perspective, while FIG. 1B illustrates the semiconductor structure which includes the diode from a cross-sectional view. Note a transistor out of the diode in the semiconductor structure is also illustrated in FIG. 1B, and some of the contacts (e.g., the conductive conducts 81) of the diode are omitted in the figures for brevity. As shown in the FIG. 1A and FIG. 1B, the semiconductor structure includes a substrate 10, a FEOL structure 12, and a metallization structure 14. The FEOL structure 12 is formed over or in proximity to a first surface 10A of the substrate 10. The metallization structure 14 is formed over the FEOL structure 12.

In some embodiments, the substrate 10 is a silicon substrate. In some embodiments, the substrate 10 may be made by some other semiconductor material such as germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, and the like, may also be used. Additionally, the substrate 10 may include a silicon-on-insulator (SOI) substrate. Generally, an SOI substrate includes a layer of semiconductor material such as epitaxial silicon, germanium, silicon germanium, SOI, silicon germanium on insulator (SGOI), or combinations thereof. The substrate 10 may be doped with a p-type dopant such as boron, boron fluorine, aluminum, gallium, or the like. The substrate may alternatively be doped with an n-type dopant such as phosphorus, arsenic, antimony, or the like.

The FEOL structure 12 may include various kinds of individual devices and at least one ILD layer. The individual devices may include various microelectronic devices, for example, an image sensor such as metal-oxide-semiconductor field effect transistor (MOSFET), large scale integration (LSI) system, complementary metal-oxide-semiconductor (CMOS) imaging sensor (CIS), micro-electro-mechanical system (MEMS), active device, passive device, and the like. The individual devices may be electrically connected to a conductive region of the substrate 10. In addition, the individual devices may be electrically isolated from adjacent individual devices by the ILD layer, respectively. In some embodiments, the boundary of the substrate 10 and the FEOL structure 12 may be defined after the FEOL structure 12 is formed, or such definition may be varied in different scenarios. For example, the doped or implanted regions that formed in the silicon wafer may be a portion of the substrate and may be a portion of the FEOL structure in the meantime.

As shown in FIG. 1B, the semiconductor structure includes a transistor within a transistor region 200 in the substrate 10 and a diode within a diode region 201 in the substrate 10, respectively. The transistor region 200 may adjacent to the diode region 201. In some embodiments, the diode region 201 includes a well region 21 with a first conductivity type in the substrate 10. In some embodiments, the semiconductor structure includes more conductive regions, for example, a first implant region 22 may extend from the first surface 10A of the substrate 10 into the substrate 10, and a second implant region 23 may also extend from the first surface 10A of the substrate 10 into the substrate 10. In some embodiments, the first implant region 22 may have a first conductivity type approximate to the first surface 10A, while the second implant region 23 have a second conductivity type that different to the first conductivity type and approximate to the first surface 10A and surrounded by the first implant region 22. For example, in the scenario that the semiconductor structure includes a high voltage p-well diode, the first implant region 22 may have p-type dopants therein and the concentration of the p-type dopants is higher than that in the well region 21. On the other hand, the second implant region 23 may have n-type dopants therein, and the concentration of the dopants is also higher than that in the well region 21. In some embodiments, the first implant region 22 and the second implant region 23 are isolated by one or more shallow trench isolation (STI) features 24 extending from the first surface 10A of the substrate 10 into the substrate 10. In some circumstances, the first implant region 22 and the second implant region 23 are called oxide diffusion (OD), which refer to active areas of the semiconductor structure.

As shown in FIG. 1A, in some embodiments, the first implant region 22 includes a ring shape, and the second implant region 23 is surrounded by the first implant region 22 from the top view perspective. In the circumstances that the diode is a high voltage (HV) diode or a middle voltage (MV) diode, the second implant region 23 thereof may have a large size, for example, the width W1 of the second implant region 23 may be greater than about 3.02 μm, while the length L1 thereof is greater than the width W1. In the case of the size of the second implant region 23 is large, a first ILD layer 61 formed thereon will have a concave surface profile after the chemical mechanical polishing (CMP) operation is performed, which is called dishing. That is, the CMP operation is employed to planarize the upper surface of the first ILD layer 61, but unwanted recess is induced thereby when the size of the second implant region 23 is large.

To be more detailed, since the semiconductor structure includes at least one transistor within the transistor region 200, a high-k metal gate (HKMG) process may be applied for forming the gate structure of the transistor; however, when there is a dishing formed by the CMP operation prior to forming the metal gate of the transistor, the material for forming the metal gate of the transistor will fill such unwanted recess in the diode region 201, and thus a metal residue will be left therein after the gate replacement operation. The metal residue will cause short circuit and the diode is malfunctioned thereby. More details will be described later in FIG. 6F.

Therefore, in some embodiments of the present disclosure, one or more dummy patterns may be utilized to prevent the formation of the unwanted recess over the second implant region 23 of the diode. For example, as shown in FIG. 1A and FIG. 1B, a dummy gate structure 30 is disposed on the first surface 10A of the substrate 10, and a portion of the diode (e.g., a portion of the diode region 201 from the top view perspective) is free from covered by the dummy gate structure 30. In present disclosure, the dummy gate structure 30 may be called a dummy stripe as well. In such embodiment, the first implant region 22 and the second implant region 23 are free from covered by the dummy gate structure 30 since the dummy gate structure 30 is located between the first implant region 22 and the second implant region 23, and formed over the STI features 24 between the first implant region 22 and the second implant region 23. The dummy gate structure 30 is firmed prior to the high-k metal gate process; that is, the dummy gate structure 30 may be formed from one or more poly gate structures (i.e., polysilicon structure) over the substrate 10, while these poly gate structures in the diode region 201 are identical to the poly gate structures for forming the metal gates in the transistor region 200. Conventionally, the diode region 201 is free from forming gate structures thereon, but by forming the poly gate structures as illustrated in the present disclosure, the one or more poly gate structures in the diode region 201 may be used to prevent the dishing issue. That is, the CMP operation performed to planarize the ILD layer will not induce concave surface profile within the diode region 201. More details of the manufacturing method will be described later.

To prevent the dishing issue of the ILD layer effectively, the dummy gate structure 30 within the diode region 201 should not expose a large block of ODs; in other words, the dummy gate structure 30 should be arranged in an adequate density within the diode region 201. As shown in FIG. 1A, in the circumstances that the first implant region 22 is frame-shaped and the second implant region 23 is located within such frame and thus surrounded by the first implant region 22 from the top view perspective, the dummy gate structure 30 may be disposed between the first implant region 22 and the second implant region 23. For example, the dummy gate structure 30 includes a first dummy gate 31 (or called a first dummy stripe) and a second dummy gate 32 (or called a second dummy stripe), while the first dummy gate 31 is in proximity to a first side 22A of the first implant region 22, and the second dummy gate in proximity to a second side 22B opposite to the first side 22A of the first implant region 22. To avoid the dishing issue as previously mentioned, a distance D1 between the first dummy gate 31 and the second dummy gate 32 should be no greater than about 3.5 µm. To put it another way, since the dummy gate structure 30 is used to against the dishing issue due to CMP operation, the dummy gate structure 30 should be arranged effectively and to avoid occupying the active area of the diode region, and therefore, in some embodiments of the present disclosure, a width of the portion of the diode region 201 that free from covered by the dummy gate structure 30 is no greater than about 3.2 µm. Furthermore, a width of each portions of the dummy gate structure 30 is less than about 0.1 µm.

In some embodiments, an interval or a distance D2 between the first dummy gate 31 and the second implant region 23 is about 0.24 µm. Likewise, the distance D3 between the second dummy gate 32 and the second implant region 23 is also about 0.24 µm. Accordingly, based on the fact that the distance D1 between the first dummy gate 31 and the second dummy gate 32 should be no greater than about 3.5 µm, the width W1 of the second implant region 23 should not greater than about 3.02 µm in the circumstances that the second implant region 23 is sandwiched by the first dummy gate 31 and the second dummy gate 32 from the top view perspective. In other words, if the width W1 of the second implant region 23 is greater than about 3.02 µm, the combination of the first dummy gate 31 and the second dummy gate 32 which disposed within the frame-shaped first implant region 22 cannot effectively prevent the dishing issue. Hence, more dummy gates may be added in the diode region 201.

Figure 2A:
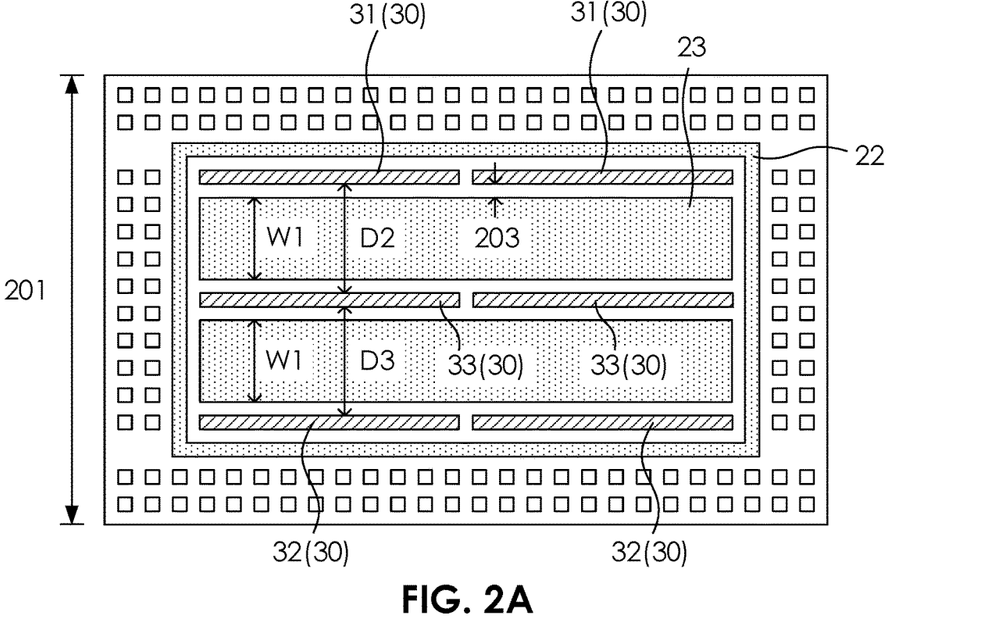
FIG. 2A illustrates a top view of a portion of a semiconductor structure according to some embodiments of the present disclosure.
Figure 2B:
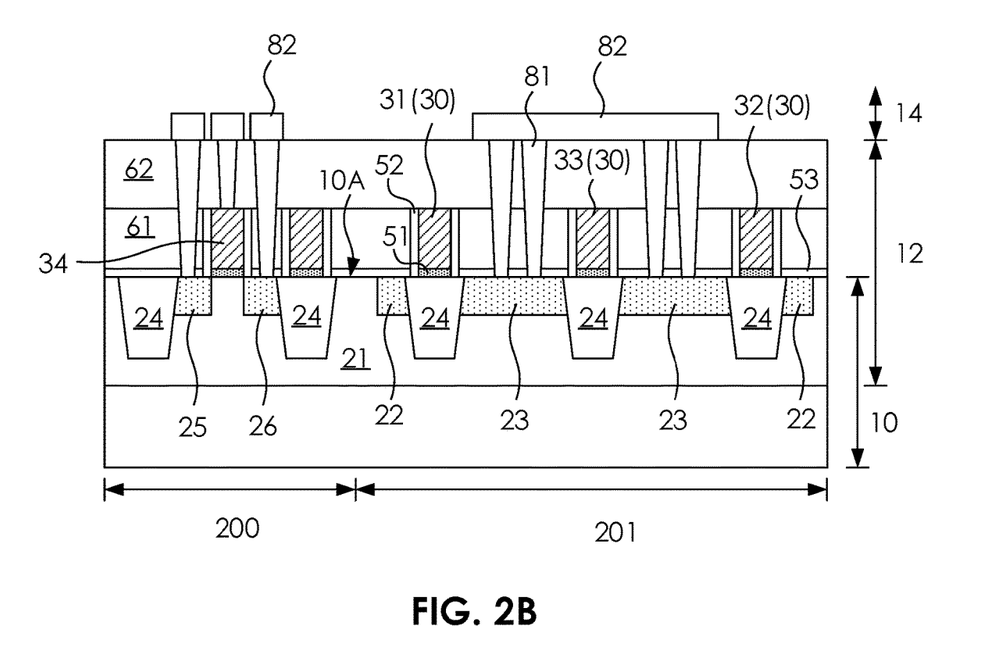
FIG. 2B illustrates a cross-sectional view of a semiconductor structure according to some embodiments of the present disclosure.

For example, as shown in FIG. 2A and FIG. 2B, in some embodiments, the dummy gate structure 30 may further include a third dummy gate 33 (or called a third dummy stripe). In some embodiments, the third dummy gate 33 is disposed over a center portion of the well region 21. In some embodiments, the third dummy gate 33 is disposed between the first dummy gate 21 and the second dummy gate 22. The third dummy gate 33 is landed on an isolation feature (e.g., a STI feature 24) in the substrate 10 and in contact with the second implant region 23. By utilizing the third dummy gate 33, the size of the second implant region 23 may be increased, for example, a distance D2 between the first dummy gate 31 and the third dummy gate 33 is no greater than about 3.5 µm, and a distance D3 between the second dummy gate 32 and the third dummy gate 33 is also no greater than about 3.5 µm. To put it another way, the third dummy gate 33 is needed for the second implant region 23 having a larger size, for example, the upper limitation of the total width of the two portions of second implant region 23 may be up to about 6.04 µm (i.e., two widths W1 with an upper limitation at about 3.02 µm). In other words, for a large OD in the diode region, at least an additional STI feature and at least an additional dummy pattern may be used to split the large OD, and the dishing issue may thus be avoided. Furthermore, in the circumstances that the width W1 of the second implant region 23 is larger than about 6.04 µm, more than one dummy gate (e.g., two or more third dummy gates 33) may be arranged between the first dummy gate 31 and the second dummy gate 32 for preventing the dishing issue of the ILD layer.

Comparing to the limitation of the width W1 of the second implant region 23 in preventing the dishing, since the dummy gate structure 30 is disposed along the long side of the first implant region 22 and/or that of the second implant region 23, the lengths of the first implant region 22 and the second implant region 23 (e.g., the length L1 previously shown in FIG. 1A) are irrelevant to the dishing issue, and thus there is no limit to the lengths thereof.

Figure 3A:
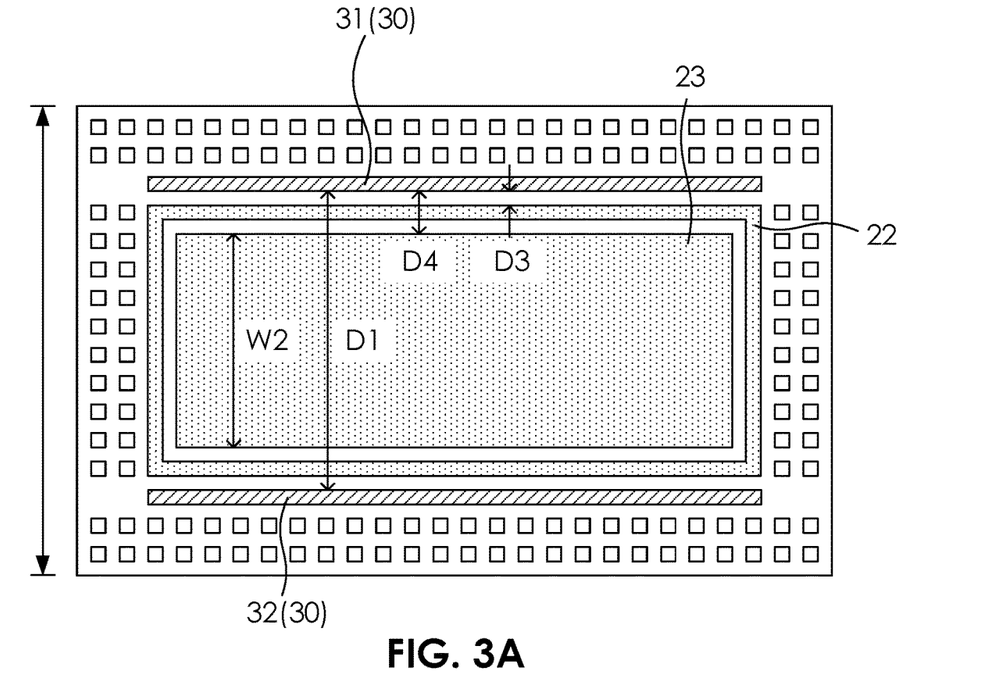
FIG. 3A illustrates a top view of a portion of a semiconductor structure according to some embodiments of the present disclosure.
Figure 3B:
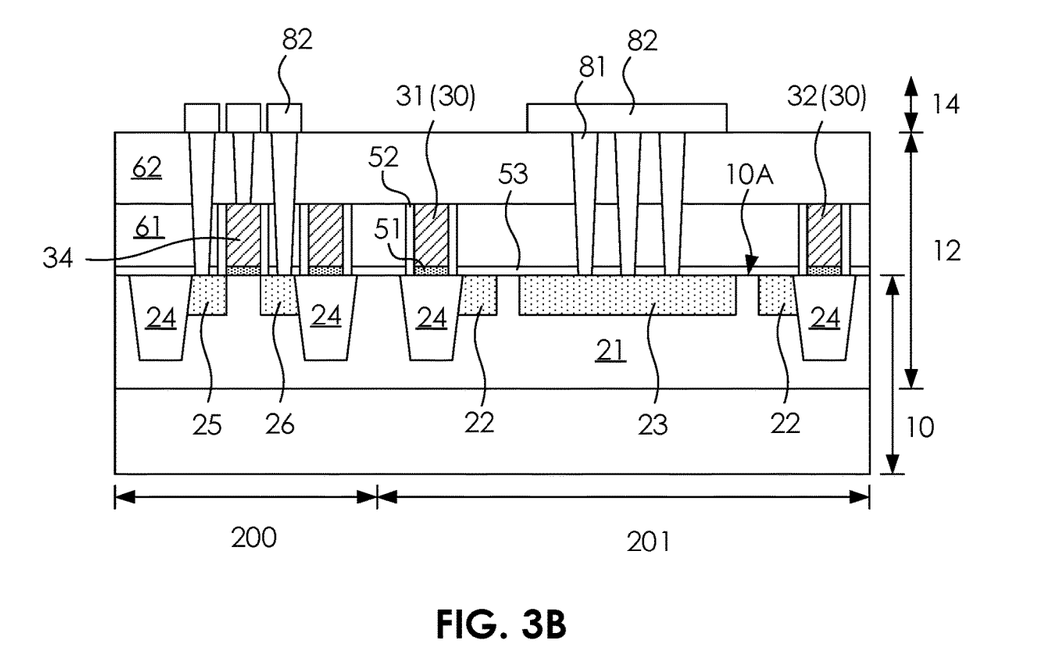
FIG. 3B illustrates a cross-sectional view of a semiconductor structure according to some embodiments of the present disclosure.

As shown in FIG. 3A and FIG. 3B, in some embodiments, the dummy gate structure 30 may be formed out of the first implant region 22 from the top view perspective. As shown in FIG. 3A, the first dummy gate 31 and the second dummy gate 32 are disposed in proximity to the outer sides of the first implant region 22. Since the dummy gates of the dummy gate structure 30 should not be spaced greater than about 3.5 µm, in such embodiments, the distance D1 between the first dummy gate 31 and the second dummy gate 32 is also no greater than about 3.5 µm. Accordingly, a width W2 of the second implant region 23 in such embodiments is less than those (i.e., the width W1) in the embodiments previously shown in FIG. 1A to FIG. 2B. For example, in the circumstances that a distance D3 between the dummy gate structure 30 and the outer side of the first implant region 22 is about 0.11 µm, and a distance D4 between the second implant region 23 and the outer side of the first implant region 22 is about 0.3 µm, and therefore the width W2 of the second implant region 23 should no greater than about 2.68 µm. In other words, once the dummy gate structure 30 is moved to surround the first implant region 22 from the top view perspective, the critical dimension of the second implant region 23 of the diode should be decreased.

Figure 4A:
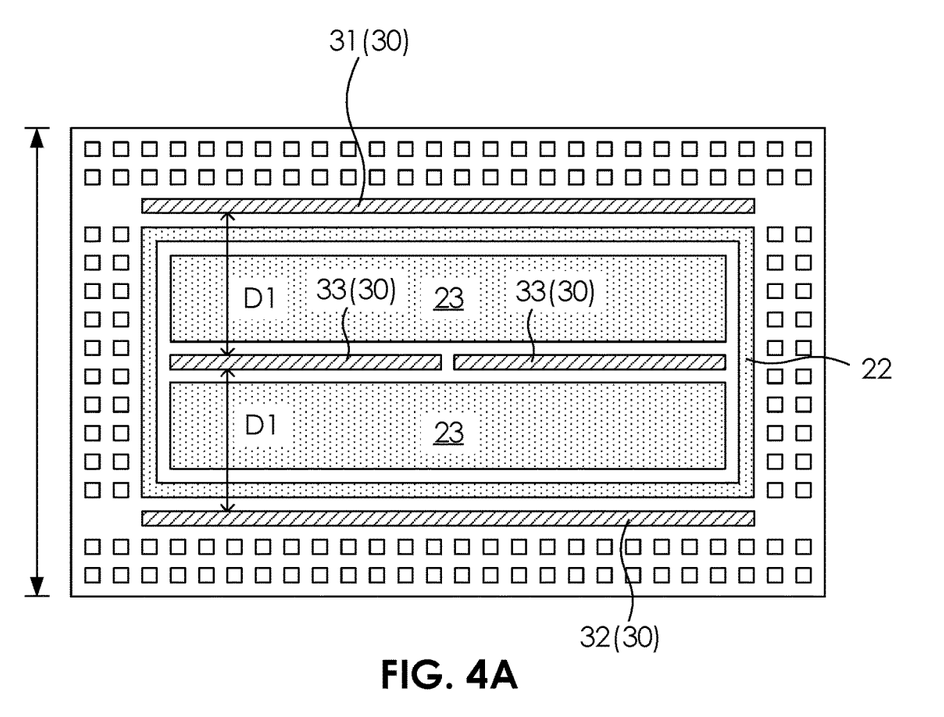
FIG. 4A illustrates a top view of a portion of a semiconductor structure according to some embodiments of the present disclosure.
Figure 4B:
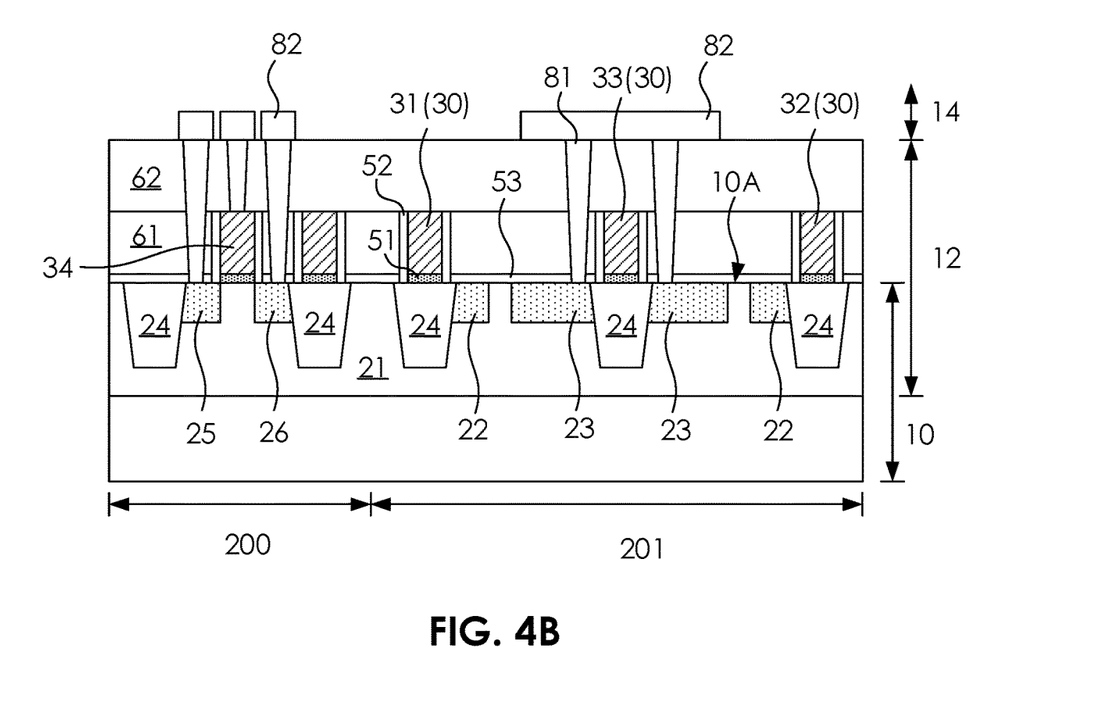
FIG. 4B illustrates a cross-sectional view of a semiconductor structure according to some embodiments of the present disclosure.

As shown in FIG. 4A and FIG. 4B, in some embodiments, the first dummy gate 31 and the second dummy gate 32 are disposed in proximity to the outer sides of the first implant region 22, while the third dummy gate 33 is disposed over the center portion of the second implant region 23. Such embodiments may be implemented to the scenario that the second implant region 23 is large (e.g., the width thereof is greater than about 2.68 µm), and therefore the second implant region 23 need to be separated into at least two portions.

Figure 5:
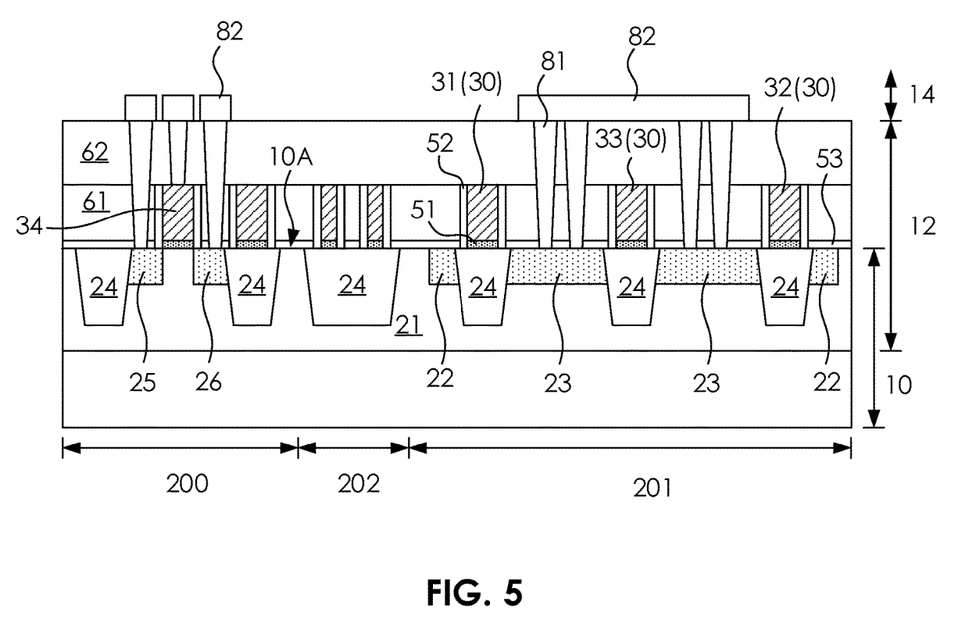
FIG. 5 illustrates a cross-sectional view of a semiconductor structure according to some embodiments of the present disclosure.

As shown in FIG. 5, in some embodiments, the semiconductor structure further includes a boundary region 202 between the transistor region 200 and the diode region 201. In some embodiments, the boundary region 202 includes at least a STI feature 24 extending from the first surface 10A of the substrate into the substrate 10. In some embodiments, one or more dummy gates may be disposed over the STI feature 24 in the boundary region 202.

Figure 6A:
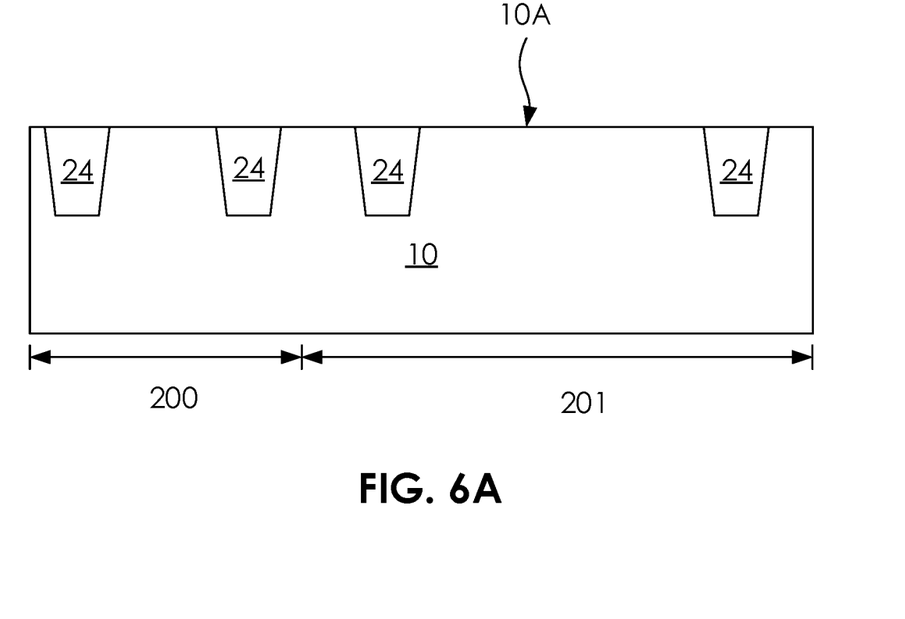
FIGS. 6A to 6L illustrate cross-sectional views of manufacturing a semiconductor structure according to some embodiments of the present disclosure.
Figure 6B:
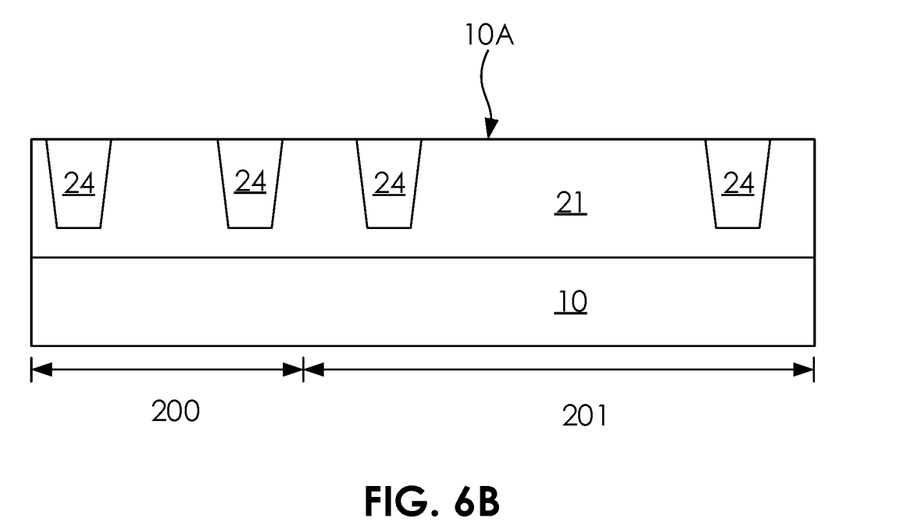

The forming of the semiconductor structure in the present disclosure may include various operations. As shown in FIG. 6A, in some embodiments, prior to forming a first polysilicon structure 41 (or called a first polysilicon stripe) and a second polysilicon structure 42 (or called a second polysilicon stripe) as later shown in FIG. 6C, a plurality of STI features 24 are formed in the substrate 10 to isolate one or more devices from each other. The STI features 24 may include silicon oxide, silicon nitride, silicon oxynitride, fluoride-doped silicate (FSG), and/or a low-k dielectric material known in the art. The STI features 24 may be formed by using processes such as reactive ion etch (RIE) of the substrate 10 to form trenches which are then filled with an insulator material using deposition processes followed by a CMP operation. Then, as shown in FIG. 6B, the well region 21 may be formed by implanting the dopants into the substrate 10 from the first surface 10A.

Figure 6C:
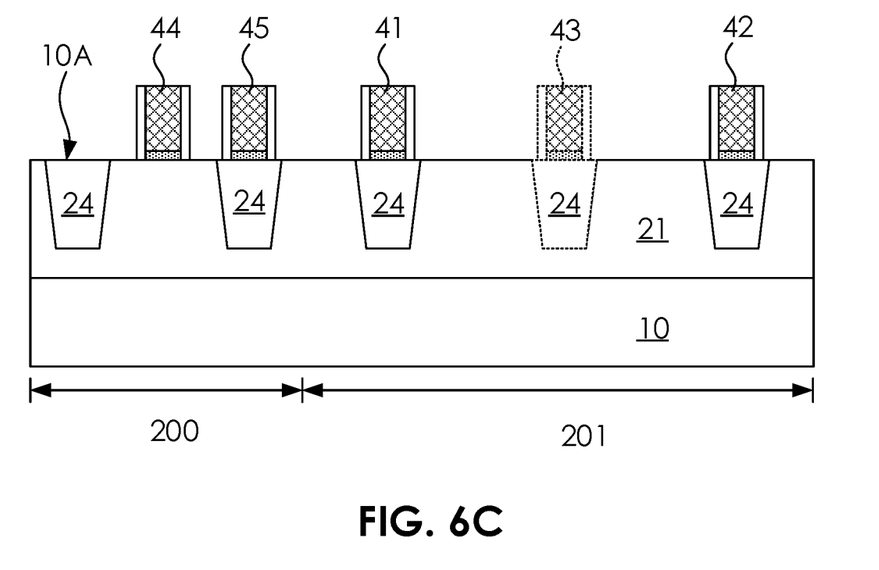

Subsequently, as shown in FIG. 6C, the first polysilicon structure 41 and the second polysilicon structure 42 are formed over the first surface 10A of the substrate 10 after the STI features 24 and the well regions 21 are both fabricated. Moreover, the polysilicon structures within the diode region 201 and the polysilicon structures within the transistor region 200 may be formed concurrently, while the polysilicon structures within the diode region 201 are fabricated for forming the dummy gate and those within the transistor region 200 are for forming the gate electrodes of the transistors. For example, as shown in FIG. 6C, at least a fourth polysilicon structure 44 (or called a fourth polysilicon stripe) is formed in the transistor region 200, and the first polysilicon structure 41, the second polysilicon structure 42, and the fourth polysilicon structure 44 are formed concurrently.

In some embodiments, a third polysilicon structure 43 (or called a third polysilicon stripe) may be formed over the substrate 10 in the diode region 201 as well, particularly, in the circumstances that the distance between the first polysilicon structure 41 and the second polysilicon structure 42 is greater than about 3.5 µm. The third polysilicon structure 43 may increase the density of the polysilicon structures within the diode region 201, for instance, the distance between the first polysilicon structure 41 and the third polysilicon structure 43 is no greater than about 3.5 µm. Likewise, the distance between the second polysilicon structure 42 and the third polysilicon structure 43 is also no greater than about 3.5 µm. In some embodiments, a plurality of third polysilicon structures 43 may be formed between the first polysilicon structure 41 and the second polysilicon structure 42, while the distance between each two adjacent polysilicon structures is no greater than about 3.5 µm. In some embodiments, a fifth polysilicon structure 45 (or called a fifth polysilicon stripe) may be formed in the transistor region 200 concurrently as well, and the fifth polysilicon structure 45 is used for forming the dummy gate structure within the transistor region 200 in the later operations. Overall, the arrangement of the polysilicon structures shown in FIG. 6C is adjustable, and they at least may be adjusted to any forms corresponding to any embodiments previously shown in FIG. 1A to FIG. 5.

Overall, even though a plurality of polysilicon structures are formed over the first surface 10A of the substrate 10, the purpose and features thereof are different. As previously mentioned, even though the polysilicon structures within the diode region 201 and the polysilicon structures within the transistor region 200 may be formed concurrently, while the polysilicon structures within the diode region 201 are fabricated for forming the dummy gate and those within the transistor region 200 are for forming the gate electrodes of the transistors.

In some embodiments, a dielectric layer 51 is formed under each of the first polysilicon structure 41 and the second polysilicon structure 42. That is, the first polysilicon structure 41 and the second polysilicon structure 42 are landed on the dielectric layer 51. The dielectric layer 51 is made of high-k dielectric materials such as hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof. The dielectric layer 51 may be formed by atomic layer deposition (ALD), chemical vapor deposition (CVO), or other suitable technique.

In some embodiments, a spacer 52 is formed on each side of the first polysilicon structure 41 and the second polysilicon structure 42. In some embodiments, the spacer 52 is made of silicon nitride.

Figure 6D:
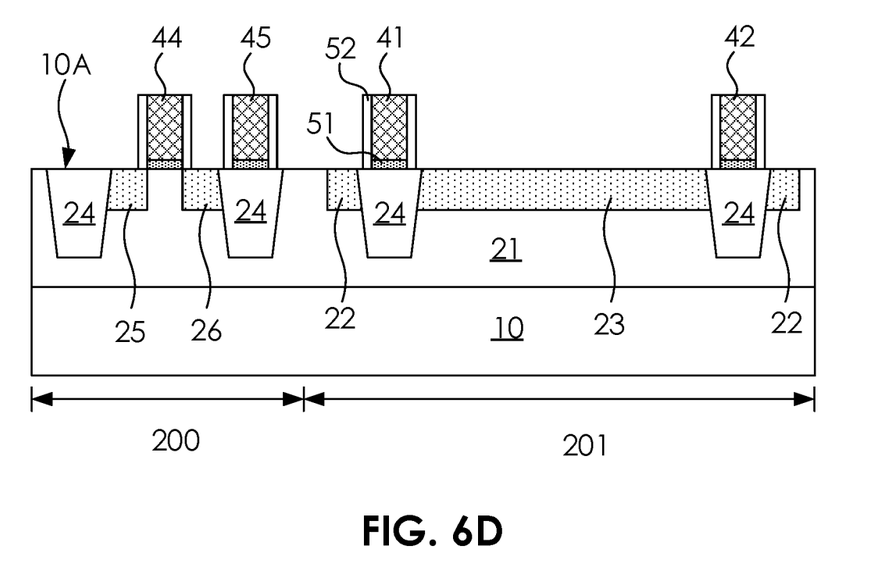

As shown in FIG. 6D, in some embodiments, the first implant region 22 and the second implant region 23 are formed in the diode region 201 subsequently. Since the first implant region 22 has the first conductivity type and the second implant region 23 has a second conductivity type opposite to the first conductivity type, the implant regions in the diode region 201 are not formed concurrently. However, because the source region 25 and/or the drain region 26 in the transistor region 200 may have a conductivity type identical to that of the first implant region 22 and/or the second implant region 23, and thus at least some portions in the transistor region 200 and the diode region 201 may be implanted concurrently. In some alternative embodiments, a lightly doped source and drain region (LDD regions) may be formed prior to forming the spacer 52 on the sides of the fourth polysilicon structure 44 in the transistor region 200.

Figure 6E:
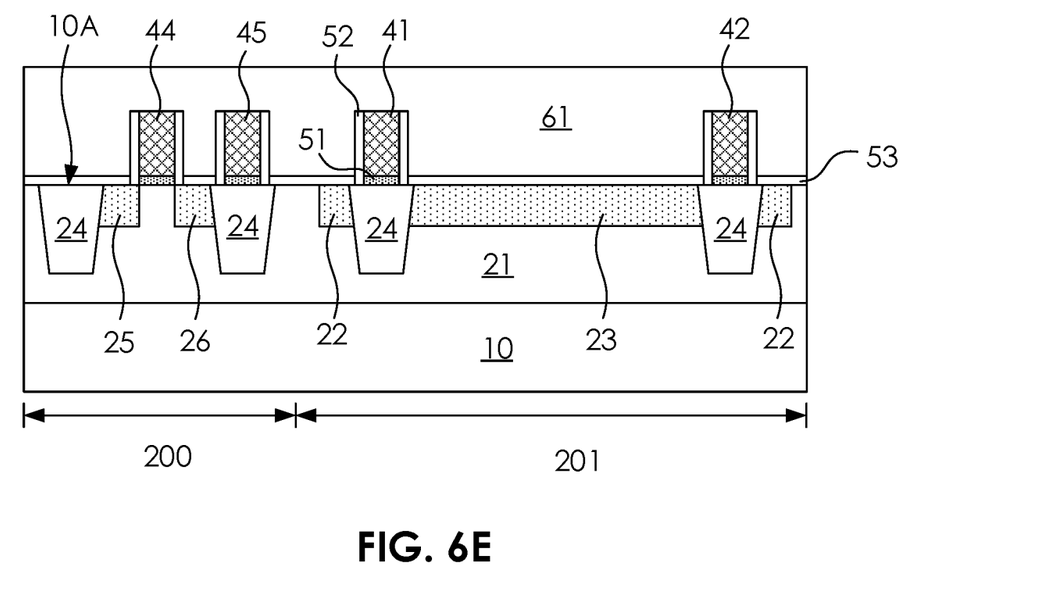

As shown in FIG. 6E, in some embodiments, the contact etch stop layer (CESL) 53 may be formed over the first surface 10A of the substrate 10. The CESL 53 includes a dielectric material, such as SiNx, SiOx, SiON, SiC, SiCN, BN, SiBN, SiCBN, or combination thereof. The CESL 53 may be formed by PECVD, sub atmospheric chemical vapor deposition (SACVD), low pressure chemical vapor deposition (LPCVD), ALD, HDPCVD, plasma enhanced atomic layer deposition (PEALD), molecular layer deposition (MID) or plasma impulse chemical vapor deposition (PICVD), or any suitable technique.

A first ILD layer 61 may be formed over the substrate 10 subsequently, while the first ILD layer 61 may cover the polysilicon structures including the first polysilicon structure 41 and the second polysilicon structure 42 in the diode region 201 and the fourth polysilicon structure 44 and the fifth polysilicon structure 45 in the transistor region 200. The first ILD layer 61 includes silicon oxide, silicon oxy-nitride, silicon carbide, or other suitable low-k material. The first ILD layer 61 may be formed by chemical vapor deposition.

Figure 6F:
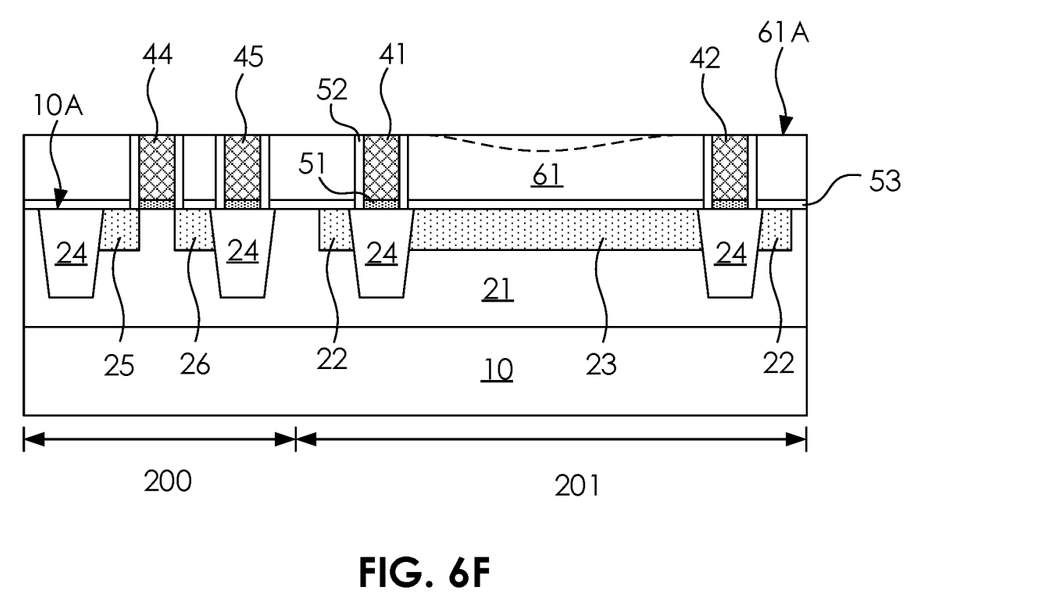

As shown in FIG. 6F, after the CESL 53 and the first ILD layer 61 are formed over the substrate 10, the first ILD layer 61 will be planarized to expose the top surfaces of the polysilicon structures by the CMP operation. In the embodiments of the present disclosure, the distance between the polysilicon structures within the diode region 201 is no greater than about 3.5 µm, therefore the upper surface of the planarized first ILD layer 61 may not have a dishing profile shown by dotted line in FIG. 6F. Comparing with the scenario that the large size diode without having polysilicon structures, or without having polysilicon structures disposed in a proper density and/or arrangement, the embodiments in the present disclosure may ensure the upper surface 61A of the planarized first ILD layer 61 is substantial flat within the diode region 201. Generally, the number of the polysilicon structures need to be arranged within the high voltage or middle voltage diode is proportional to the width of the implant region thereof.

Figure 6G:
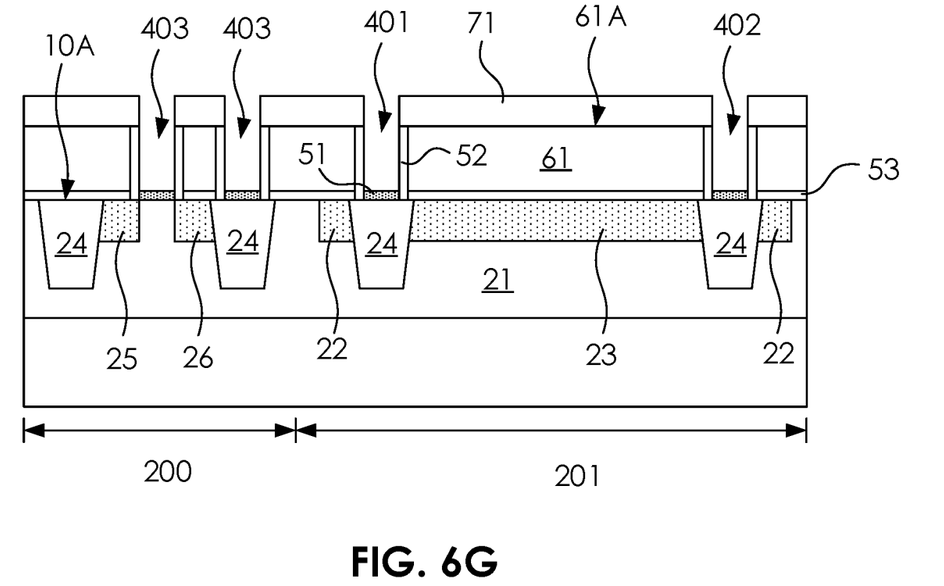
Figure 6H:
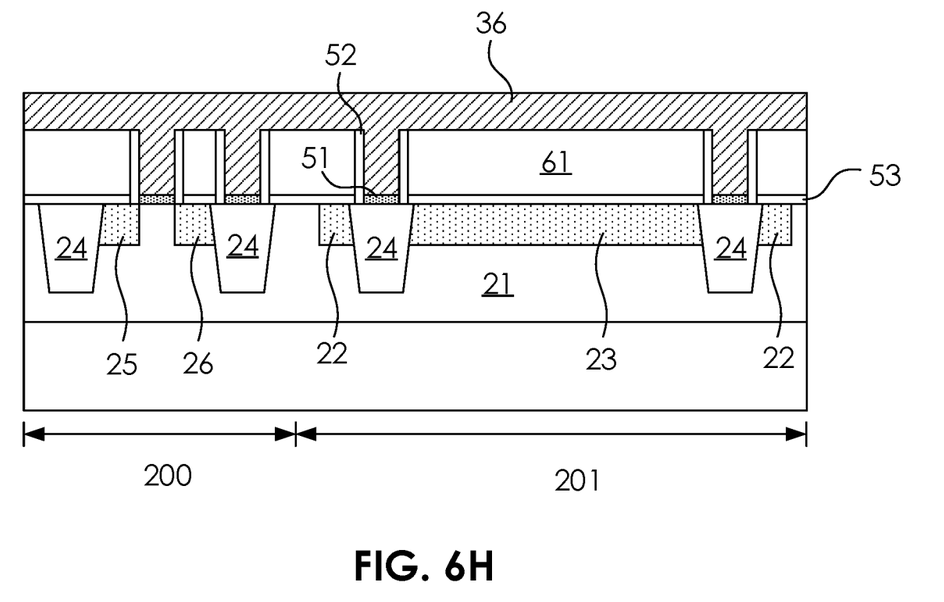
Figure 6I:
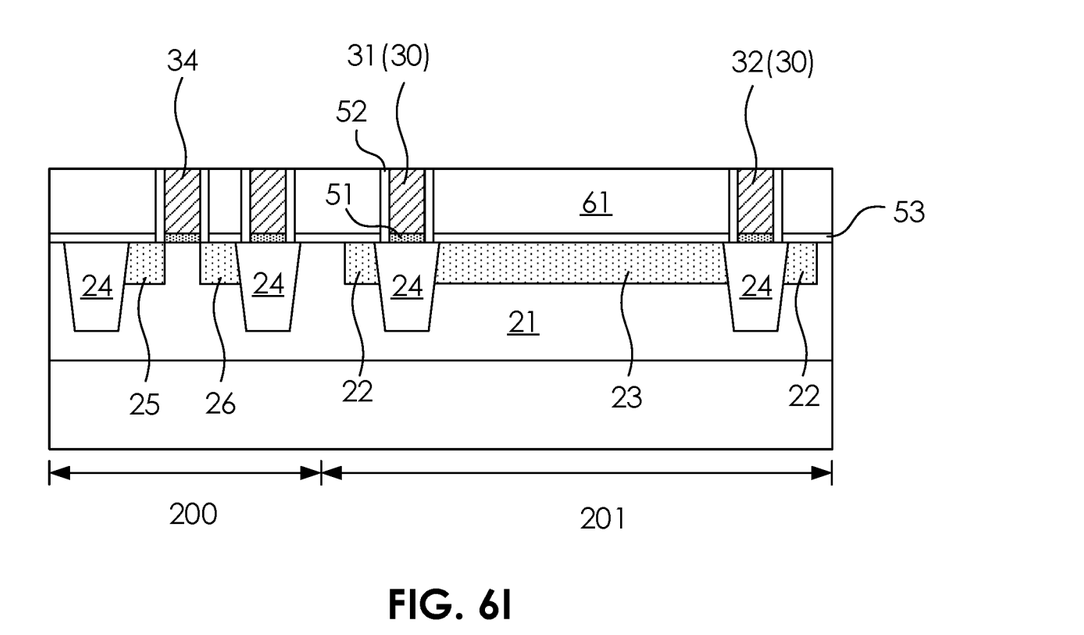

As shown in FIG. 6G, FIG. 6H, and FIG. 6I, in some embodiments, a gate replacement operation may be implemented after the first layer 61 is planarized. In some embodiments, a first mask layer 71 is formed over the first ILD layer 61, and the first polysilicon structure 41 and the second polysilicon structure 42 are exposed from the first mask layer 71. Furthermore, in some embodiments of the present disclosure, the fourth polysilicon structure 44 in the transistor region 200 of the substrate 10 is also exposed from the first mask layer 71, and the first polysilicon structure 41, the second polysilicon structure 42, and the fourth polysilicon structure 44 are removed concurrently before removing the first mask layer 71.

The first polysilicon structure 41 and the second polysilicon structure 42 are removed respectively by a dry etching, a wet etching or a reactive ion etching operation for forming a first gate recess 401 and a second gate recess 402. Afterwards, a conductive material 36 may be filled into the first gate recess 401 and the second gate recess 402. Generally, the metal gate may include a work function material and an additional conductive layer and depending on the form of the transistor, but in the present disclosure, since the gate structures within the diode region 201 are dummy gates, the conductive material 36 filled in the first gate recess 401 and the second gate recess 402 are substantially identical to the conductive material 36 filled in a transistor gate recess 403 formed within the transistor region 200 for forming the real gate electrode. In other words, the conductive material 36 filled in the first gate recess 401 and the second gate recess 402 (or further at least a third gate recess formed by removing the third polysilicon structure 43 in a larger diode) are substantially less limited. Moreover, as previously illustrated in FIG. 6F, because the planarized first ILD layer 61 does not have a dishing profile, there will be no unwanted recess filled by conductive material 36 over the second implant region 23.

As shown in FIG. 6I, in some embodiments, after the gate recesses are filled by the conductive material 36, a CMP operation may be performed align the top surfaces of the first dummy gate 31, the second dummy gate 32 and the upper surface 61A of the first ILD layer 61 within the diode region 201. Meanwhile, the top surfaces of the first dummy gate 31 and the second dummy gate 32 are also leveled with the top surface of the gate stripe 34 in the transistor region 200.

Figure 6J:
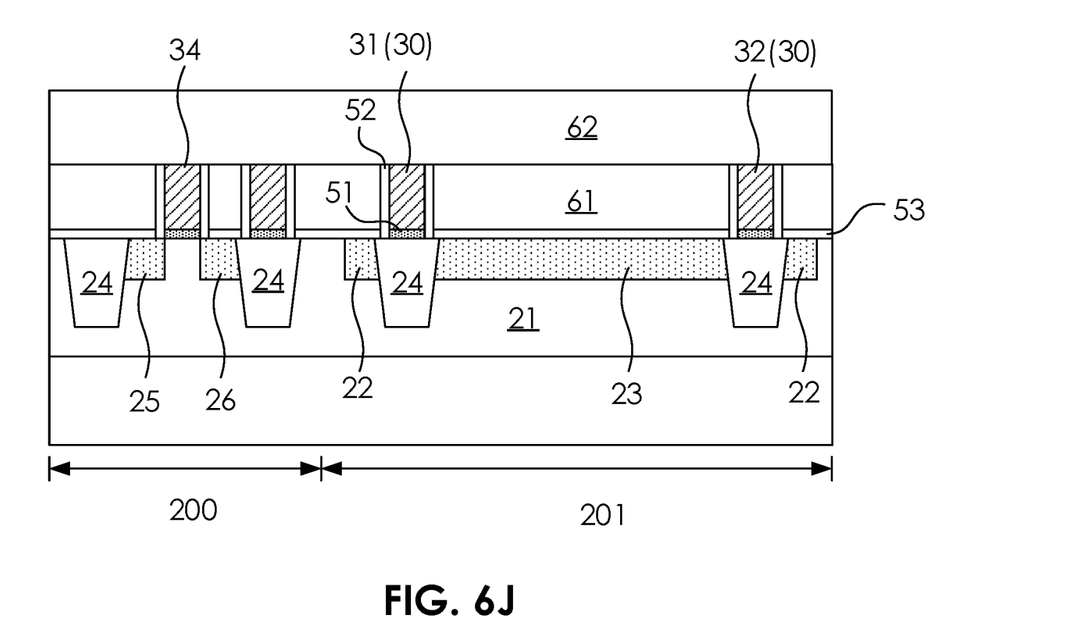
Figure 6K:
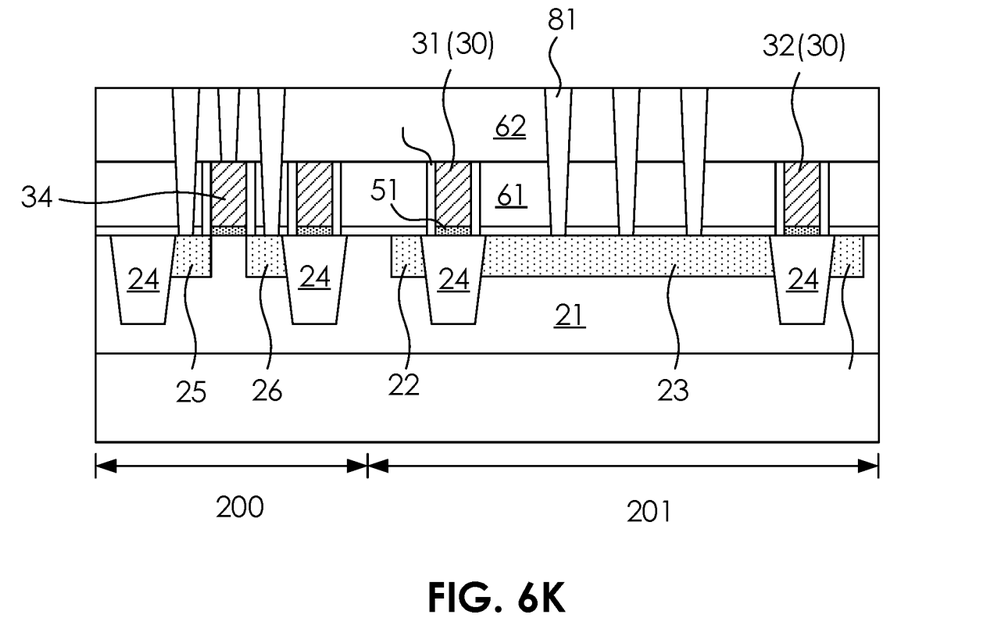
Figure 6L:
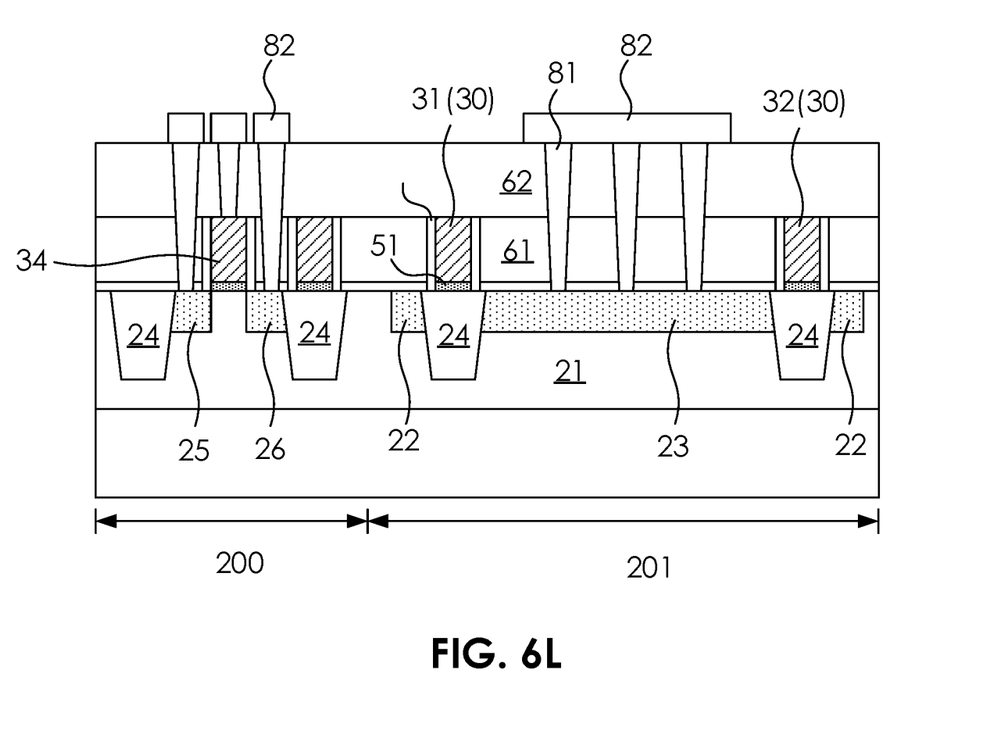

As shown in FIG. 6J, FIG. 6K, and FIG. 6L, subsequently, a plurality of conductive contacts 81 and multilayer interconnect features may be formed over the substrate 10, configured to connect the diode or the transistor formed in the previous mentioned operations. For example, a second ILD layer 62 may be formed over the first ILD layer 61, and then a mask layer (not shown in the figure) for forming the conductive contacts 81 is formed over the second ILD layer 62. The holes for forming the conductive contacts 81 may penetrate the second. ILD layer 62, the first ILD layer 61, and the CESL 53, and thus the conductive materials filled therein may in contact with the implanted regions in the semiconductor structure. After the conductive contacts 81 are formed, a horizontal interconnect, such as a metal line 82 may be formed over the second ILD layer 62. The conductive materials for forming the conductive contacts 81 and the metal line 82 may include copper, tungsten, and/or silicide. In some examples, a damascene and/or dual damascene operation may be used to form a copper related multilayer interconnect structure.

Figure 7A:
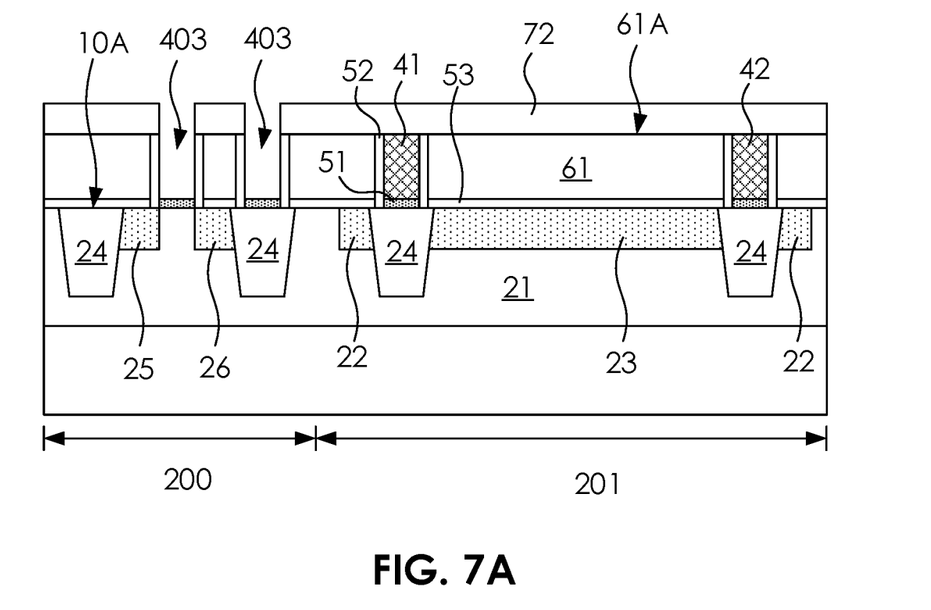
FIGS. 7A and 7B illustrate cross-sectional views of manufacturing a semiconductor structure according to some embodiments of the present disclosure.
Figure 7B:
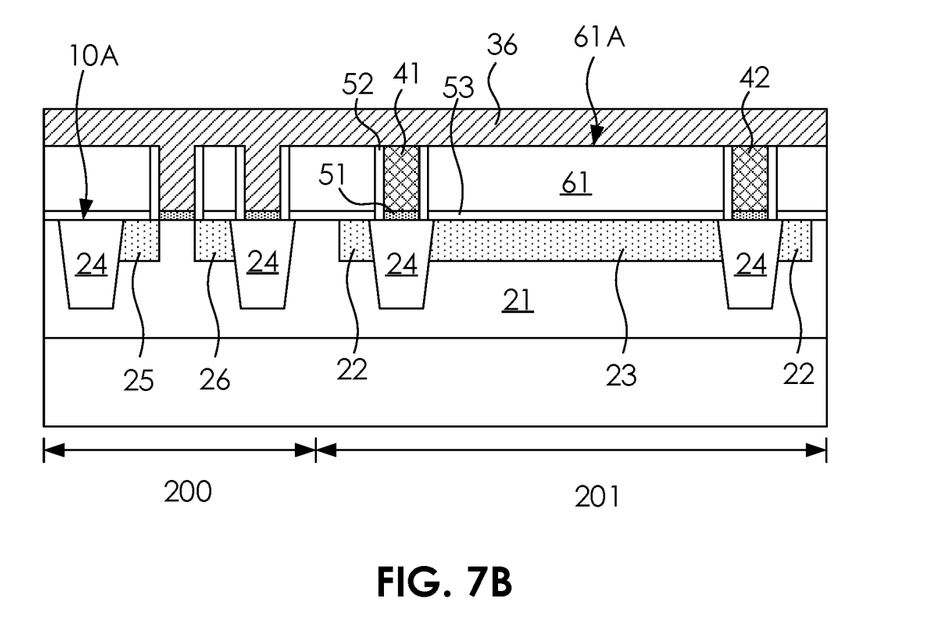

In some embodiments, the dummy gate structure 30 within the diode region 201 and the gate stripe 34 within the transistor region 200 may be made by different materials. For example, as shown in FIG. 7A and FIG. 7B, a second mask layer 72 may be formed over the first ILD layer 61 after planarizing the first ILD layer 61. The first polysilicon structure 41 and the second polysilicon structure 42 are entirely covered by the second mask layer 72, whereas the fourth polysilicon structure 44 and the fifth polysilicon structure 45 in the transistor region 200 of the substrate 10 is exposed from the second mask layer 72. Accordingly, only the polysilicon structures within the transistor region 200 are removed during the gate replacement operation. After the second mask layer 72 is removed, the gate recesses 403 within the transistor region 200 are filled by the conductive material 36, while the first polysilicon stricture 41 and the second polysilicon structure 42 are remained in the diode region 201.

Figure 8:
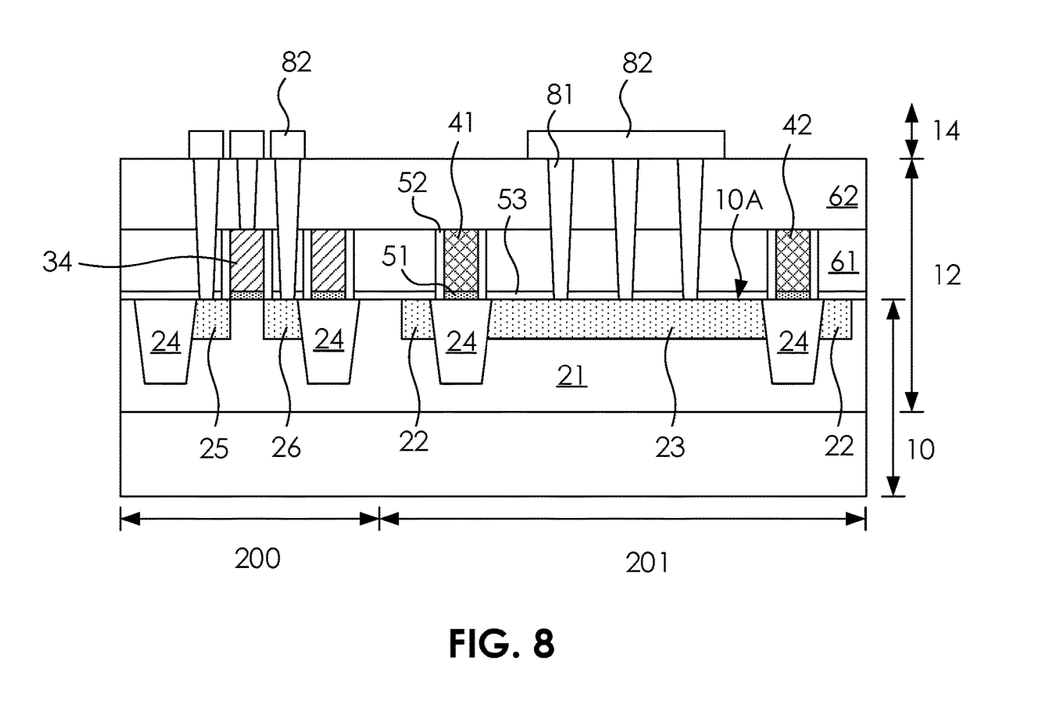
FIG. 8 illustrates a cross-sectional view of a semiconductor structure according to some embodiments of the present disclosure.

As shown in FIG. 8, in such embodiments, the dummy gate structure 30 within the diode region 201 and the gate structures within the transistor region 200 are made by different materials. For instance, the dummy gate structure 30 may include the first polysilicon structure 41 and the second polysilicon structure 42. The subsequent operations for forming the second ILD layer 62, the conductive contacts 81, and the metal line 82 are identical to the operations previously shown in FIG. 6J to FIG. 6L and omitted here for brevity.

According to the present disclosure, a semiconductor structure and method for manufacturing thereof are disclosed. Overall, the disclosed semiconductor structure includes a plurality of dummy gates within the diode region of the substrate, and the dummy gates belong to the diode structure may be used to prevent the dishing issue during the CMP planarizing operation of the ILD layer. Furthermore, the abovementioned dummy gates are arranged effectively in the present disclosure, for example, a distance between the dummy gates is no greater than about 3.5 µm, and the dishing issue induced by CMP may be extremely alleviated. Accordingly, no metal residue would be left between the ILD layers and the deforming or damage of the diode device can be avoided.

In one exemplary aspect, a semiconductor structure is provided. The semiconductor structure includes a substrate, a diode region, and a dummy stripe. The substrate has a first surface. The diode region is in the substrate. The diode region includes a first implant region of a first conductivity type approximate to the first surface, and a second implant region of a second conductivity type approximate to the first surface and surrounded by the first implant region. The dummy stripe is on the first surface and located between the first implant region and the second implant region.

In another exemplary aspect, a semiconductor structure is provided. The semiconductor structure includes a substrate, a transistor region, and a diode region. The substrate has a first surface. The transistor region is in the substrate. The diode region is in the substrate and adjacent to the transistor region. The diode region includes a first implant region, a second implant region surrounded by the first implant region, and a first dummy stripe and a second dummy stripe over the first surface of the substrate. The first dummy gate and the second dummy gate are in proximity to two opposite sides of the first implant region, respectively.

In yet another exemplary aspect, a method for manufacturing a semiconductor structure is provided. The method includes the operations as follows. A first polysilicon stripe and a second polysilicon stripe are formed over a diode region of a substrate, wherein a distance between the first polysilicon stripe and the second polysilicon stripe is no greater than about 3.5 µm. A first implant region and a second implant region are formed within the diode region of the substrate. A first ILD layer is formed over the substrate, and the first ILD layer covers the first polysilicon stripe and the second polysilicon stripe. The first ILD layer is planarized to expose a top surface of the first polysilicon stripe and a top surface of the second polysilicon stripe.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
 a substrate having a first surface;
 a diode region in the substrate, comprising:
  a first implant region of a first conductivity type approximate to the first surface; and
  a second implant region of a second conductivity type approximate to the first surface and surrounded by the first implant region; and
 a dummy stripe on the first surface and located between the first implant region and the second implant region, wherein the dummy stripe comprises:
  a first dummy stripe in proximity to a first side of the first implant region;
  a second dummy stripe in proximity to a second side of the first implant region opposite to the first side; and
  a third dummy stripe between the first dummy stripe and the second dummy stripe;
 wherein a distance between the third dummy stripe and either of the first dummy stripe or the second dummy stripe is no greater than about 3.5 µm.

2. The semiconductor structure of claim 1, wherein:
 the first implant region extends from the first surface of the substrate into the substrate; and
 the second implant region extends from the first surface of the substrate into the substrate.

3. The semiconductor structure of claim 2, wherein the first implant region comprises a ring shape from a top view perspective.

4. The semiconductor structure of claim 1, further comprising a transistor region adjacent to the diode region, wherein a gate stripe in the transistor region is leveled with the dummy stripe in the diode region.

5. The semiconductor structure of claim 1, wherein the dummy stripe comprises a, dummy polysilicon gate structure of a dummy metal gate structure.

6. A semiconductor structure, comprising:
 a substrate having a first surface;
 a transistor region in the substrate; and
 a diode region in the substrate and adjacent to the transistor region, the diode region comprising:
  a first implant region;
  a second implant region surrounded by the first implant region; and
  a first dummy stripe and a second dummy stripe over the first surface of the substrate and in proximity to two opposite sides of the first implant region, respectively;
 wherein a distance between the first dummy stripe and the second dummy stripe is no greater than about 3.5 µm.

7. The semiconductor structure of claim 6, wherein the first dummy stripe and the second dummy stripe are between the first implant region and the second implant region.

8. The semiconductor structure of claim 6, further comprises a third dummy stripe between the first dummy stripe and the second dummy stripe.

9. The semiconductor structure of claim 8, wherein the third dummy stripe is landed on an isolation feature in the substrate and in contact with the second implant region.

10. The semiconductor structure of claim 8, wherein a top surface of the first dummy stripe and a top surface of the second dummy stripe are leveled with a top surface of a gate stripe in the transistor region.

11. A semiconductor structure, comprising:
 a substrate having a first surface;
 a transistor region in the substrate;
 a diode region in the substrate and adjacent to the transistor region, the diode region comprising:
  a first implant region of a first conductivity type approximate to the first surface; and
  a second implant region of a second conductivity type approximate to the first surface and surrounded by the first implant region, Wherein the first implant region and the second implant region are isolated by a first shallow trench isolation (STI) feature extending from the first surface of the substrate into the substrate;
 a first dummy stripe disposed over the first STI feature and in proximity to a first outer side of the first implant region; and
 a second dummy stripe disposed over the first STI feature and in proximity to a second outer side opposite to the first outer side of the first implant region.

12. The semiconductor structure of claim 11, wherein a distance between the first dummy stripe and the second dummy stripe is no greater than about 3.5 µm.

13. The semiconductor structure of claim 11, further comprising a third dummy stripe disposed over a center portion of the second implant region.

14. The semiconductor structure of claim 13, wherein a width of the second implant region is greater than about 2.68 µm.

15. The semiconductor structure of claim 11, further comprising a boundary region between the transistor region and the diode region.

16. The semiconductor structure of claim 15, wherein the boundary region comprises second shallow trench isolation (STI) feature extending from the first surface of the substrate into the substrate, and wherein the semiconductor structure further comprises a fourth dummy stripe disposed over the second STI feature in the boundary region.

17. The semiconductor structure of claim 11, wherein the first implant region is isolated from the second implant region by a shallow trench isolation (STI) feature.

18. The semiconductor structure of claim 11, wherein the second implant region is separated into two portions by the first STI feature.

19. The semiconductor structure of claim 11, wherein the first STI is laterally adjacent to different conductivity types of implant regions.

20. The semiconductor structure of claim 11, wherein a width of the first dummy stripe is less than about 0.1 µm.

* * * * *